United States Patent
Ohuchi et al.

(10) Patent No.: US 7,592,690 B2
(45) Date of Patent: Sep. 22, 2009

(54) SEMICONDUCTOR DEVICE INCLUDING SEMICONDUCTOR ELEMENTS MOUNTED ON BASE PLATE

(75) Inventors: Shinji Ohuchi, Tokyo (JP); Shigeru Yamada, Tokyo (JP); Yasushi Shiraishi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/077,145

(22) Filed: Mar. 11, 2005

(65) Prior Publication Data

US 2005/0156298 A1    Jul. 21, 2005

Related U.S. Application Data

(62) Division of application No. 10/657,139, filed on Sep. 9, 2003, which is a division of application No. 09/757,663, filed on Jan. 11, 2001, now Pat. No. 6,673,651, which is a division of application No. 09/460,984, filed on Dec. 15, 1999, now Pat. No. 6,201,266.

(30) Foreign Application Priority Data

Jul. 1, 1999   (JP)   ................... 11-187658

(51) Int. Cl.
    *H01L 23/02*    (2006.01)
(52) U.S. Cl. .................. 257/686; 257/777; 257/790; 257/E25.006; 257/23.085
(58) Field of Classification Search .............. 257/685, 257/686, 723, 777–778, 781, 786, 773, 787, 257/737–738, 790, 782–784, E25.006, E25.013, 257/E25.018, E25.021, E25.027, E21.614, 257/E23.085
See application file for complete search history.

(56) References Cited

U.S. PATENT DOCUMENTS

| | | | |
|---|---|---|---|
| 5,239,198 A | * | 8/1993 | Lin et al. ..................... 257/693 |
| 5,467,252 A | * | 11/1995 | Nomi et al. ................. 361/760 |
| 5,668,405 A | | 9/1997 | Yamashita |
| 5,861,678 A | | 1/1999 | Schrock |
| 5,866,949 A | | 2/1999 | Schueller |

(Continued)

FOREIGN PATENT DOCUMENTS

JP    57-031166    2/1982

(Continued)

OTHER PUBLICATIONS

Fujitsu Develops World's First Eight-Stacked Multi-Chip Package Mar. 13, 2002 http://pr.fujitsu.com/en/news/2002/03/13.html.

*Primary Examiner*—A. Sefer
*Assistant Examiner*—Dilinh P Nguyen
(74) *Attorney, Agent, or Firm*—Volentine & Whitt, P.L.L.C.

(57) ABSTRACT

A semiconductor device including a first semiconductor element mounted on a first surface of a base plate, wherein solder balls are formed on a second opposite surface of the base plate such that the second opposite surface includes an area without solder balls. At least one second semiconductor element is mounted to the base plate at the area of the second surface without solder balls. The at least one semiconductor element may be mounted to the base plate using solder joints.

8 Claims, 15 Drawing Sheets

U.S. PATENT DOCUMENTS

| | | | |
|---|---|---|---|
| 5,880,590 | A | 3/1999 | Desai et al. |
| 5,895,965 | A | 4/1999 | Tanaka et al. |
| 5,925,934 | A | 7/1999 | Lim |
| 5,949,140 | A | 9/1999 | Nishi et al. |
| 5,989,982 | A * | 11/1999 | Yoshikazu ................ 438/462 |
| 6,025,648 | A | 2/2000 | Takahashi et al. |
| 6,031,292 | A | 2/2000 | Murakami et al. |
| 6,063,646 | A * | 5/2000 | Okuno et al. ............. 438/107 |
| 6,081,037 | A | 6/2000 | Lee et al. |
| 6,083,776 | A | 7/2000 | Manteghi |
| 6,166,443 | A * | 12/2000 | Inaba et al. ............... 257/777 |
| 6,201,302 | B1 | 3/2001 | Tzu |
| 6,208,525 | B1 | 3/2001 | Imasu et al. |
| 6,229,215 | B1 * | 5/2001 | Egawa ...................... 257/777 |
| 6,229,217 | B1 | 5/2001 | Fukui et al. |
| 6,259,154 | B1 | 7/2001 | Niwa |
| 6,278,192 | B1 * | 8/2001 | Takigawa et al. .......... 257/787 |
| 6,287,892 | B1 | 9/2001 | Takahashi et al. |
| 6,326,696 | B1 | 12/2001 | Horton et al. |
| 6,404,049 | B1 | 6/2002 | Shibamoto et al. |
| 6,462,421 | B1 | 10/2002 | Hsu et al. |
| 6,774,473 | B1 | 8/2004 | Shen |
| 6,803,663 | B2 | 10/2004 | Hashimoto |

FOREIGN PATENT DOCUMENTS

| | | |
|---|---|---|
| JP | 59-117146 | 7/1984 |
| JP | 3-83940 | 8/1991 |
| JP | 4-38064 | 3/1992 |
| JP | 07-221262 | 8/1995 |
| JP | 07-240496 | 9/1995 |
| JP | 09-181256 | 7/1997 |
| JP | 10-012810 | 1/1998 |
| JP | 10-093013 | 4/1998 |
| JP | 10-294423 | 11/1998 |
| JP | 11-312780 | 11/1999 |
| JP | 2000-340736 | 12/2000 |

* cited by examiner

SEMICONDUCTOR DEVICE INCLUDING SEMICONDUCTOR ELEMENTS MOUNTED ON BASE PLATE

CROSS REFERENCE TO RELATED APPLICATIONS

This is a divisional application of application Ser. No. 10/657,139, filed Sep. 9, 2003, which is a divisional application of application Ser. No. 09/757,663, filed Jan. 11, 2001, now U.S. Pat. No. 6,673,651, which is a divisional application of application Ser. No. 09/460,984, filed Dec. 15, 1999, now U.S. Pat. No. 6,201,266, which are hereby incorporated by reference in their entirety for all purposes.

BACKGROUND OF THE INVENTION

1. Field of the Invention

The present invention relates to a semiconductor device and a method for manufacturing the same.

2. Description of the Related Art

It is remarkable that various kinds of portable electronic machinery and tools have come into fairly wide use so quickly in recent years, and they would be more widely used day by day and year by year. In compliance with such a trend, the semiconductor device of the resin sealed type to be fitted to the portable electronic apparatus has been required to have a configuration which is thinner in thickness, smaller in size and lighter in weight. In order to comply with such requirement, there has been proposed a chip size packaged (CSP) semiconductor device as a high-densely fabricated semiconductor device.

An advanced semiconductor device generally includes several different semiconductor elements or devices respectively playing different roles, for instance a role of executing the memory processing, a role of performing the logic processing and so forth. Accordingly, the condition for manufacturing these different semiconductor elements or devices has to be naturally changed based on their different roles and functions. However, it would be difficult in general to provide a single semiconductor element or device with such different roles and functions. In order to obviate this difficulty, the following way has been taken so far, that is, separately manufacturing semiconductor elements or devices with respect to every necessary function, and then organizing semiconductor elements or devices having different functions by packaging them on a single printed board. However, in case of packaging a plurality of separately manufactured semiconductor elements or devices on a single printed board, there arises a problem that the number of semiconductor elements or devices which are allowed to be packaged on one surface of the printed board has to be naturally limited, in other words, the desirable high-density packaging is made difficult or rather impossible.

In order to solve this problem, there has been proposed a structure which is completed for instance by puffing one semiconductor element on the other, connecting the wiring formed on respective semiconductor elements with each other by means of thin metal wires, and finally applying a sealing resin to the entirety of the piled-up and connected semiconductor elements to cover it therewith. According to the structure like this, the high-density packaging might be made possible without increasing the size or the surface area of the printed board. However, another problem arises in connection with the total manufacturing yield of the semiconductor device as a finished product. In general, the semiconductor elements receive a simple test for checking their performance in the state of their being in a wafer. On the other hand, the more complete final test (i.e. shipping test) is carried out with regard to only a semiconductor device in which semiconductor elements have been fabricated. Consequently, if the semiconductor device is assembled by using two semiconductor elements which have not yet passed the final test, the final manufacturing yield of the semiconductor device as a finished product is given as the product of respective manufacturing yields with respect to two semiconductor elements. Consequently, the manufacturing yield would drop in reverse proportion to the degree of packaging density of the semiconductor device, which leads to the increase in the manufacturing cost.

SUMMARY OF THE INVENTION

The present invention has been made in view of the above problems that the prior art semiconductor devices are still encountering, and the object thereof is to provide a novel and improved semiconductor device and a method for manufacturing the same, according to which it is made possible to provide high-densely packaged semiconductor devices without lowering the final manufacturing yield thereof.

In order to solve the problems described above, according to the invention, there is provided a semiconductor device which includes the first semiconductor device having a plurality of bumps formed on the backside surface thereof; the second semiconductor device having a plurality of terminals formed on the front surface thereof so as to be electrically connected with the bumps, the second semiconductor device being mounted on an area which is located on the backside surface of the first semiconductor device and has no bump therein; wherein the height of the second semiconductor device measured from the backside surface of the first semiconductor device is made lower than the height of the bump.

The second semiconductor device may be mounted on the first semiconductor device such that the surface provided with no terminal of the second semiconductor device is joined to the backside surface of the first semiconductor device with the help of an adhesive.

There is provided a recess which is formed in a predetermined area provided with no bump of the first semiconductor device and the second semiconductor may be mounted on the recess. The recess is formed as a shallow spot facing portion which is flatly shaved so as to fit the size of the second semiconductor device.

The above adhesive loses its adhesive strength when being exposed to a predetermined temperature or higher. This predetermined temperature is a temperature which is employed in the heat treatment for packaging the second semiconductor device on the first semiconductor device, for instance a temperature of 200° C. or more.

The second semiconductor device may be mounted on the first semiconductor device such that terminals of the second semiconductor device are joined to the backside surface of the first semiconductor device by means of soldered joints.

A high heat-conductive adhesive member may be stuck on the surface provided with no terminal of the second semiconductor device. This adhesive member may be a sheet-like member having a predetermined thickness.

The melting point of the soldered joint is preferably selected to be higher than a temperature employed in the heat treatment for packaging the second semiconductor device on the first semiconductor device, for instance 200° C. or more.

The second semiconductor device may be mounted on the first semiconductor device such that the backside surface of the second semiconductor device is joined to the backside surface of the first semiconductor device with the help of a sealing resin.

Furthermore, according to the invention, there is provided a method for manufacturing a semiconductor device including the first semiconductor device having a plurality of bumps which are formed on the backside surface thereof, and the second semiconductor device having a plurality of terminals which are formed on the front surface thereof and are to be electrically connected with the bumps, the second semiconductor device being mounted on an area which is located on the backside surface of the first semiconductor device without having any bump formed thereon, the method including the steps of: forming a plurality of bumps on the backside surface of the base plate for the first semiconductor device; placing a plurality of the second semiconductor devices on a mounting tape; mounting a plurality of the second semiconductor devices which are placed on the mounting tape, on the base plate; and dividing the base plate thereby obtaining a plurality of finished semiconductor devices including the first and second semiconductor devices.

The step of placing a plurality of second semiconductor devices on the mounting tape further includes the steps of: forming a plurality of terminals on a semiconductor substrate; applying a sealing resin to the semiconductor substrate to cover the entire surface thereof on which terminals are exposed and polishing the sealing resin surface after the sealing resin has been completely cured until all the surfaces of terminals are exposed; forming a plurality of slits by cutting in the sealing resin until the cutting goes into the semiconductor substrate by a predetermined depth; applying an adhesive retaining tape to the surface of the polished sealing resin; polishing the backside surface of the semiconductor substrate until reaching all the bottoms of slots; sticking a mounting tape on the polished surface of the semiconductor substrate; and removing the adhesive retaining tape.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1A:
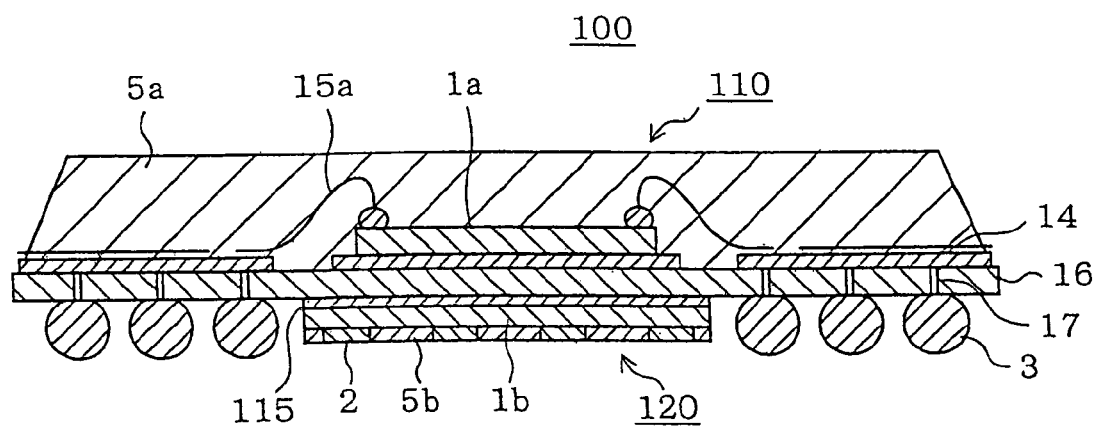
FIGS. 1A and 1B are cross-sectional views for explaining the structure of an entire semiconductor device according to the first embodiment of the invention, including the first and second semiconductor devices.

The semiconductor device and the method for manufacturing the same according to the invention will now be described in the following with reference to several preferred embodiments of the invention shown in accompanying drawings. In this specification and drawings, in order to avoid redundant repetition of detailed descriptions, the structural elements having substantially identical function and structure are designated by like reference numerals or marks.

First Embodiment

A semiconductor device 100 according to this embodiment will now be described with reference to FIGS. 1A and 1B.

Figure 1B:
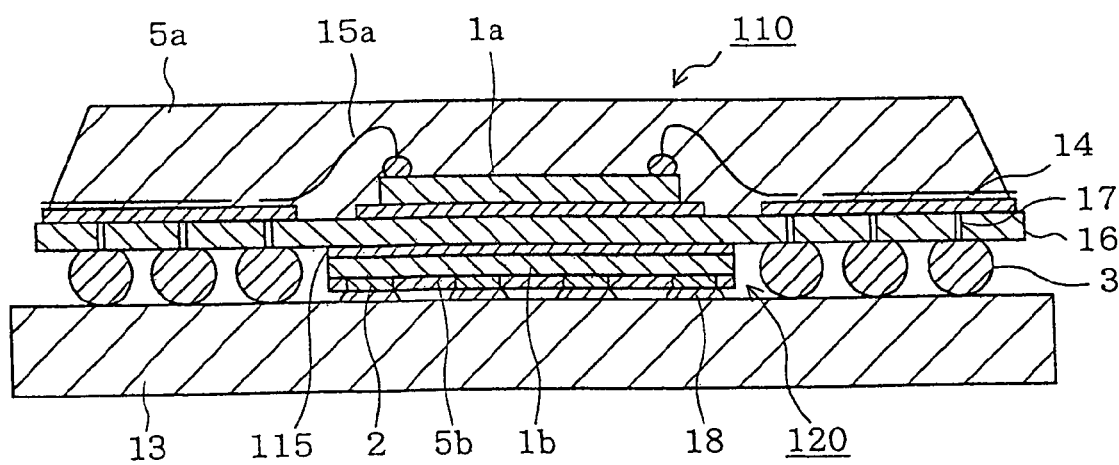

Referring to FIG. 1A, the semiconductor device 100 includes the first ball grid array (BGA) semiconductor devices (simply referred to as the first semiconductor device hereinafter, unless needed to specially identify BGA) 110 and the second chip size package (CSP) semiconductor device (simply referred to as the second semiconductor device hereinafter, unless needed to specially identify CSP) 120. The first semiconductor device 110 includes a base plate 16 made of a epoxy resin, a semiconductor element 1a and thin metal wires 15a, both being mounted on one surface of the base plate 16, and a sealing resin 5a applied to the one surface of the base plate 16 so as to entirely cover it along with the semiconductor element 1a and thin metal wires 15a. On the other surface (backside) of the base plate 16, there are arrayed in a grid shape a plurality of bumps 3 which are made of solder or the like. On one hand, the second semiconductor device 120 includes a plurality of terminals 2 and is mounted in an area located on the backside surface of the base plate 16, the area having no bump 3 formed therein. These bumps 3 of the first semiconductor device 110 and the terminals 2 of the second semiconductor device 120 are electrically connected with each other by means of printed wiring formed on another printed board 13 when the semiconductor device 100 is mounted on the printed board 13 in the later manufacturing step.

Figure 2:
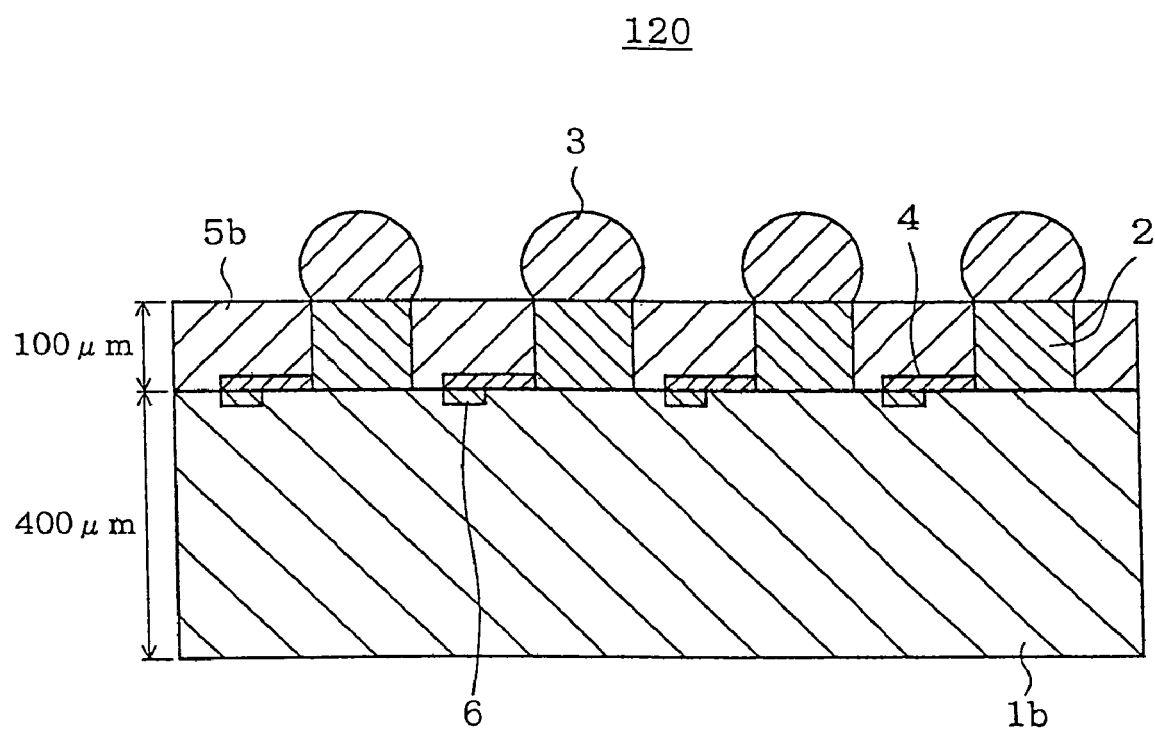
FIG. 2 is an enlarged cross-sectional view for explaining the structure of the second semiconductor device to be mounted on the first semiconductor device as shown in FIG. 1.

Referring to FIG. 2, the second semiconductor device 120 includes a semiconductor element 1b having a thickness of about 400 μm, a plurality of electrode pads 6 formed on the semiconductor element 1b, and a plurality of wiring 2 which are made of copper or the like to be electrically connected with electrode pads. The surface of the semiconductor element 1b and the wiring 2 are sealed with the help of the sealing resin 5b having a thickness of about 100 μm. The upper surface of the wiring 2 exposing from the surface of the sealing resin 5b is treated with solder, thereby forming the bump 3. A reference numeral 4 represents an additional wiring made of copper or the like for connecting the electrode pad 6 with the wiring 2.

The manufacturing method for the first and second semiconductor devices 110 and 120 will now be described with reference to FIGS. 3A through 3C and 4A through 4G as well.

Figure 3A:
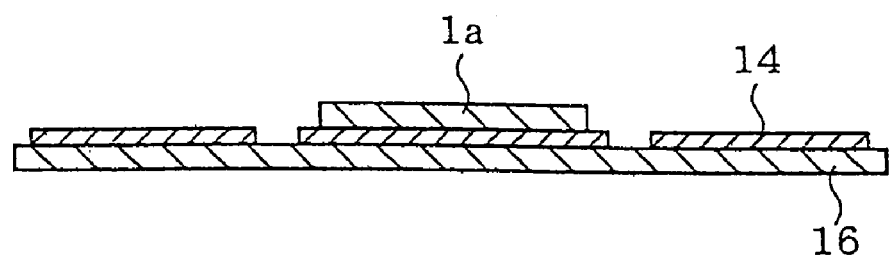
FIGS. 3A through 3C show diagrams for explaining the steps of manufacturing the first semiconductor device.
Figure 3B:
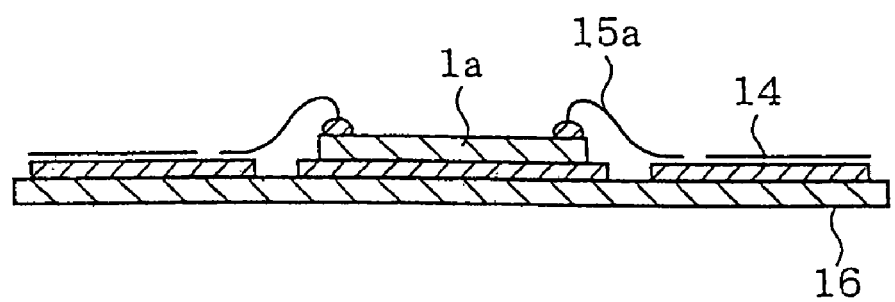
Figure 3C:
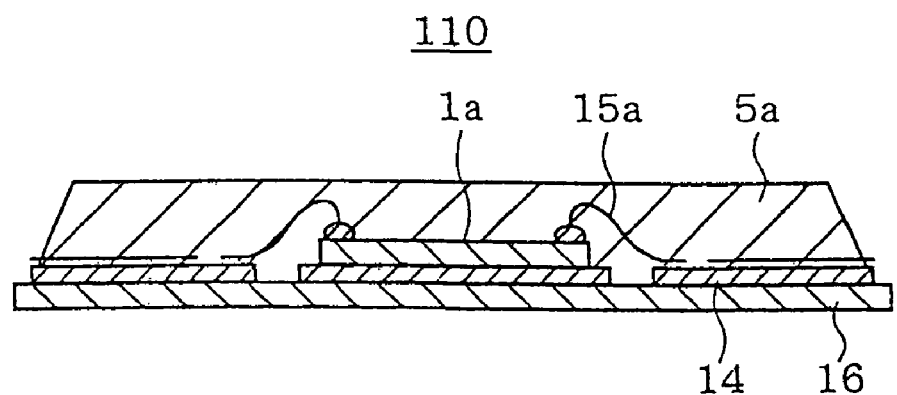

First, description will be made with regard to the first semiconductor device 110 with reference to FIGS. 3A through 3C. As shown in FIG. 3A, the semiconductor element 1a and wiring 14 are provided on the surface of the epoxy base plate 16. Then, as shown in FIG. 3B, the electrode formed on the semiconductor element 1a is connected with the wiring 14 by means of the thin metal wires 15a. In the next, as shown in FIG. 3C, the sealing resin 5a is applied to one side of the epoxy base plate 16 so as to cover all the structural elements mounted on the epoxy base plate 16. Still further, the bumps 3 are formed on the backside of the epoxy base plate 16 as shown in FIG. 1. Since the epoxy base plate 16 includes a plurality of through holes 17, the wiring 14 is electrically connected with the corresponding bumps 3, respectively.

The height of the bump 3 is preferably made to be a height substantially equal to or a little higher than the height of the second semiconductor device 120 to be mounted on the first semiconductor device 110 later. Bumps 3 will be melted in the course of the heat treatment that will be executed later for mounting the semiconductor device 100 on the printed board 13.

Figure 4A:
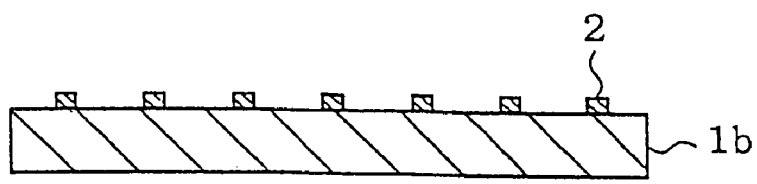
FIGS. 4A through 4G show diagrams for explaining the steps of manufacturing the second semiconductor device.
Figure 4B:
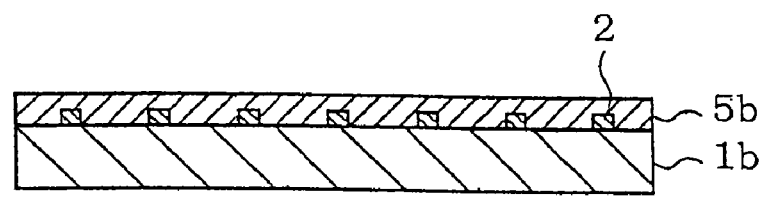
Figure 4C:
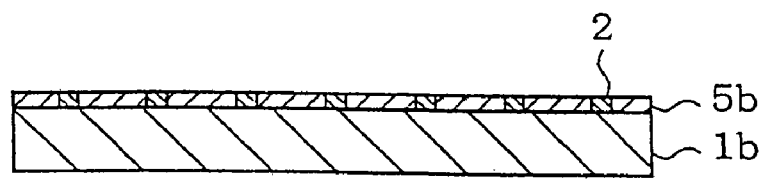

In the next, the method for manufacturing the second semiconductor device 120 will be described with reference to FIGS. 4a through 4G. Referring to FIG. 4A, a plurality of wiring 2 made of copper are formed on the surface of the semiconductor element 1b by means of electroplating or the like such that the wiring has a height of about 50 μm. Then, as shown in FIG. 4B, the sealing resin 5b is applied to the entire surface of the semiconductor element 1b so as to completely cover all the wiring 2. This step of sealing with the resin may be carried out by employing a pertinent method, for instance the transfer mold method, the potting method, the printing method and so forth. After completely curing the applied sealing resin, the entire surface of the sealing resin is polished until the surface of each wiring 2 is exposed as shown in FIG. 4C.

Figure 4D:
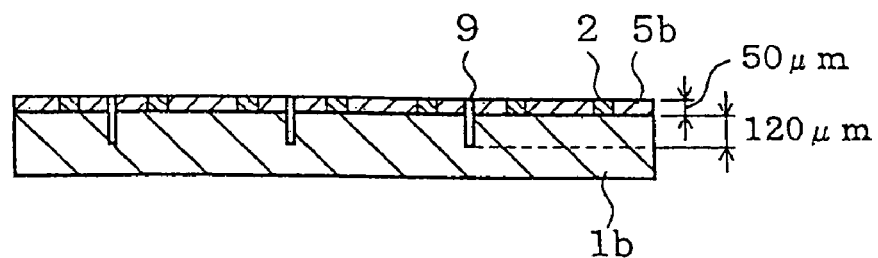

In the next, as shown in FIG. 4D, there are formed a plurality of slits 9 which extend from the sealing resin surface to the inside of the semiconductor element 1b by a predetermined depth. These slits 9 are used for dividing the semiconductor element 1b into a predetermined number of individual semiconductor element parts with wiring 2 (referred to as "semiconductor element 1b" hereinafter) in the later manufacturing step. The depth of the slit 9 can be determined by taking account of the thickness of the semiconductor element 1b'. For instance, if the thickness of the semiconductor element 1b' is designed to be 100 μm, the cutting of the slit is carried out such that the slit cutting distance or the slit depth exceeds the above designed thickness, for instance, by 20 μm or so. Consequently, it is determined that the actual slit depth to be cut is to be 170 μm by taking account of the sealing resin thickness of 50 μm.

Figure 4E:
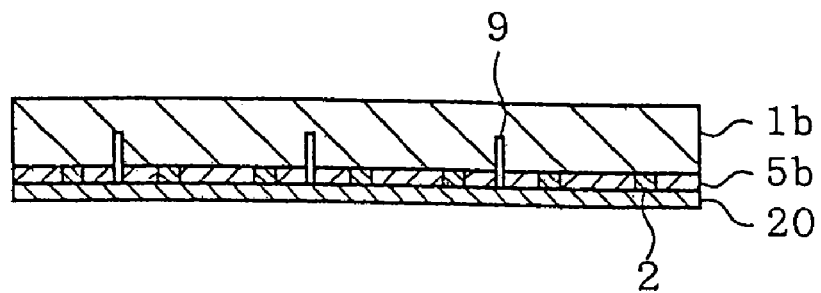
Figure 4F:
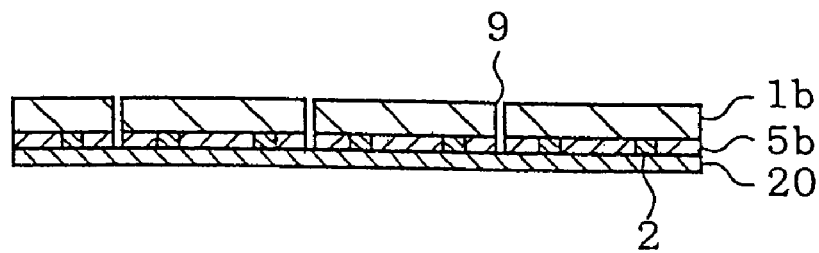

The next step is to polish the backside surface of the semiconductor element 1b. In this step, as shown in FIG. 4E, an adhesive retaining tape 20 is applied to the resin surface side of the semiconductor element 1b including slits 9 cut thereinto. The adhesive retaining tape 20 is used for the purpose of holding each of semiconductor elements 1b' to remain on the tape even after the semiconductor element 1b is divided. Also, this tape 20 loses its adhesive strength when it is irradiated by ultra-violet light rays, so that it can be removed relatively with ease from the tape applied surface. In the next, the semiconductor element 1b is mounted and fixed on a polishing means (not shown) by sucking the retaining tape side of the semiconductor element 1b. The polishing step is continued, as shown in FIG. 4F, until it reaches the bottom of each of slits 9, thereby individually divided semiconductor elements 1b' (i.e. the second semiconductor devices 120) coming to align on the adhesive retaining tape 20, eventually.

Figure 4G:
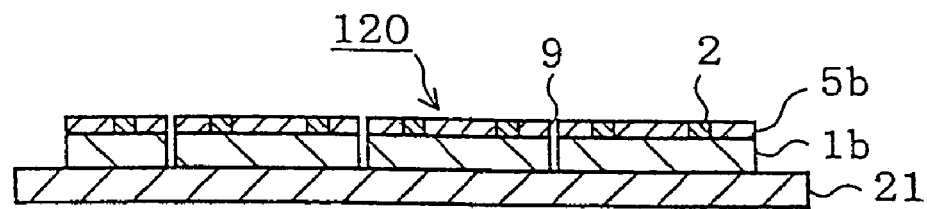

Then, as shown in FIG. 4G, a mounting tape 21 is applied to the polished surface while the retaining tape 20 is removed by irradiating it with ultra-violet light rays. The second semiconductor devices 120 aligned on the mounting tape 21 are mounted on the first semiconductor device 110 as they are.

The second semiconductor device 120 is mounted on the area of the first semiconductor device 110 in which no bump 3 is formed, with the help of an adhesive 115. The adhesive may be applied to either the area of the first semiconductor device 110 or the mounting tape 21. With the steps as described above, there is manufactured the semiconductor device 100 according to the first embodiment of the invention. Then, the semiconductor device 100 is further packaged on the printed board 13 as shown in FIG. 1B. At this time, the terminals 2 of the second semiconductor device 120 are electrically connected with printed board 13 through corresponding soldered joints 18, respectively. These soldered joints 18 are made of solder paste, which are painted on the printed board 13 in advance such that they are arranged so as to correspond to bumps 3 and terminals 2.

As described above, according to the semiconductor device 100, the second semiconductor device 120 is mounted on the area which is located on the backside surface of the first semiconductor device 110 that includes no bump 3. Moreover, both of the first and second semiconductors devices 110 and 120 are packaged into the first semiconductor device 100 in the state that they have already passed their final functional tests. Therefore, the high density package can be obtained without lowering the production yield.

Figure 5A:
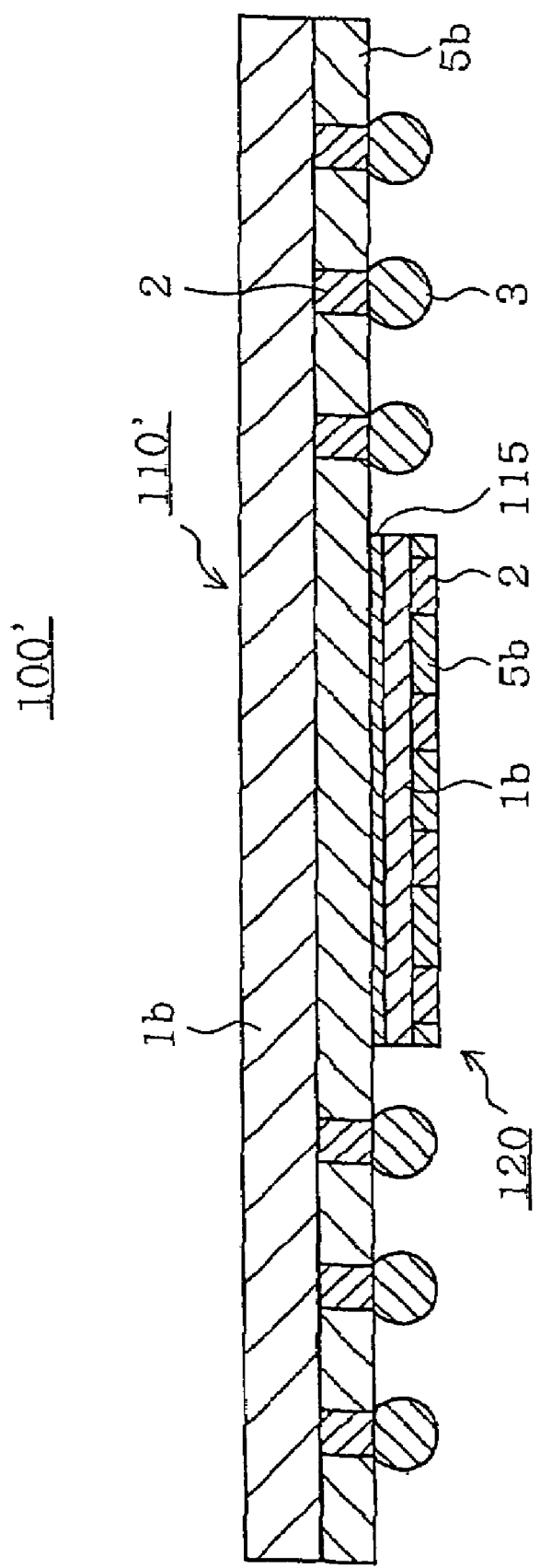
FIGS. 5A and 5B shows diagrams for explaining an application example of the first embodiment according to the invention.
Figure 5B:
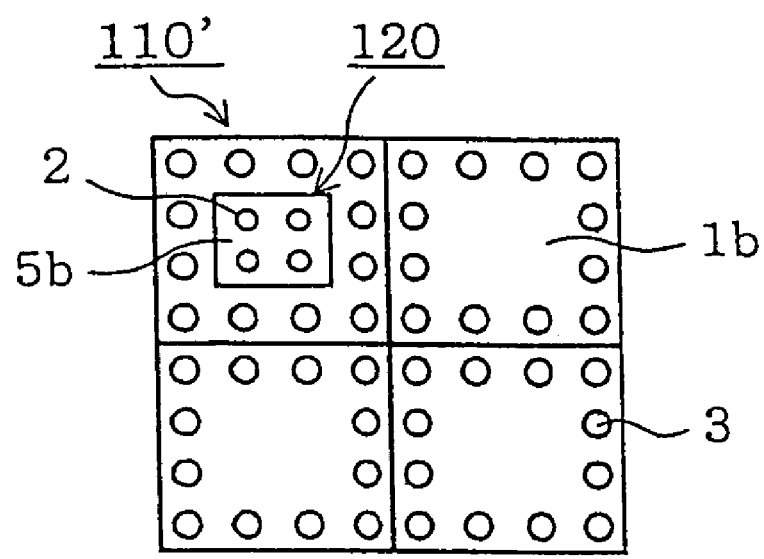

The first embodiment of the invention has been explained by way of the semiconductor device 100 which employs the first BGA semiconductor device 110. However, it should be noted that this is only an example and should not limit the invention. For instance, as shown in FIG. 5A, the first BGA semiconductor device may be constructed as the first CSP semiconductor device 110" similar to the second CSP semiconductor device 120. As shown in FIG. 5B, the first CSP semiconductor device 110" includes an area similar to that of the first BGA semiconductor 110, for mounting the second CSP semiconductor device 120 thereon. In this case, the area is provided with neither electrode 2 nor bump 3. The structure similar to this is applicable to the embodiments described in the following.

Second Embodiment

A semiconductor device 200 according to the second embodiment results from improvement of the semiconductor device 100 according to the first embodiment of the invention. A common point between semiconductor devices 200 and 100 exists in that the surface having no terminal of the second semiconductor device 220 is joined to the backside surface of the first semiconductor device 210 with the help of an adhesive 115, thereby mounting the second semiconductor device 220 on the first semiconductor device 210. The improved point of the semiconductor 200 will be described with reference to FIGS. 6A and 6B. As is previously noted, in order to avoid redundant repetition of detailed descriptions, the structural elements almost identical to those described in the previous embodiment are designated by like reference numerals or marks.

Figure 6A:
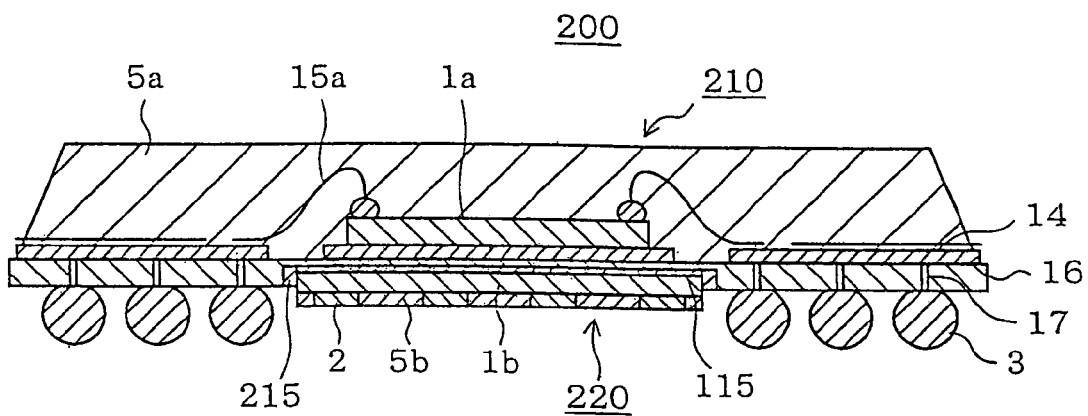
FIGS. 6A and 6B are cross-sectional views for explaining the structure of an entire semiconductor device according to the second embodiment of the invention.

Referring to FIG. 6A, the first semiconductor device 210 of the semiconductor device 200 includes an area on which the second semiconductor device 220 is mounted. This area is defined at a predetermined portion and is formed as a shallow flat recess (spot facing portion) 215 having a size corresponding to the size of the second semiconductor device 220.

Figure 6B:
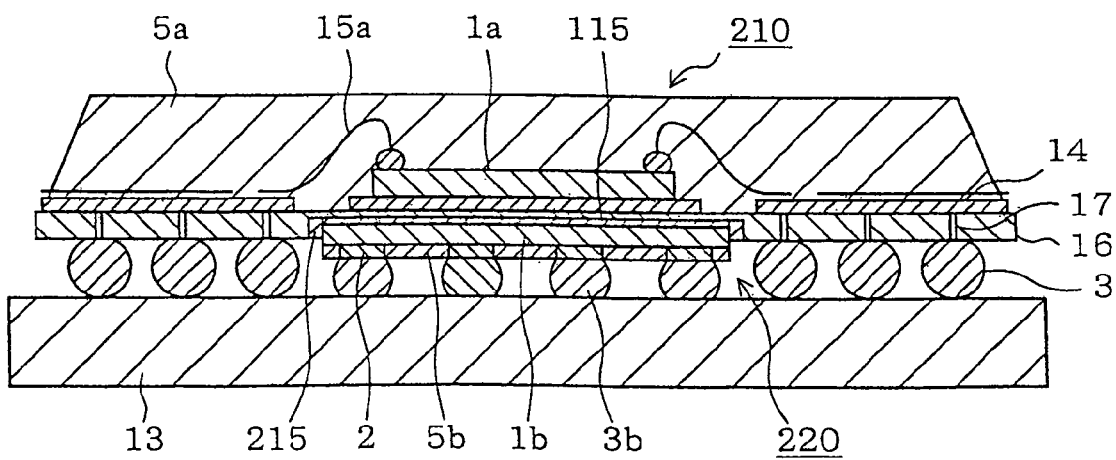

Referring to FIG. 6B, the semiconductor device 200 is mounted on the printed board 13 in the later manufacturing step. At that time, the spot facing portion 215 can accommodate the second semiconductor device 220 at least in part, so that there may be widened a space between the second semiconductor device 220 and the printed board 13. Thus, a plurality of bumps 3b made of solder or the like can be formed in this space, thereby being able to enhance reliability with regard to the electrical connection between electrical elements.

As described above, according to the semiconductor device 200, the area for mounting the second semiconductor device 220 thereon can have a wide space extended in its thickness direction. Consequently, even if the second semiconductor device 220 is a little thicker, the widened space can absorb that thickness at least in part, thus the spot facing portion 215 allowing the thicker second semiconductor device 220 to be accommodated therein. Also, with the formation of solder made bumps 3b in the widened space, it is made possible to enhance reliability with regard to the electrical connection between electrical elements.

Third Embodiment

A semiconductor device 300 according to this embodiment results from improvement of the semiconductor device 100 according to the first embodiment. A common point between the semiconductor devices 300 and 100 exists in that the surface having no terminal of the second semiconductor device 320 is joined to the backside surface of the first semiconductor device 310 with the help of an adhesive, thereby mounting the second semiconductor device 320 on the first semiconductor device 310. The improved point of the semiconductor 300 will be described with reference to FIG. 7. Again, in order to avoid redundant repetition of detailed descriptions, the structural elements almost identical to those described in previous embodiments are designated by like reference numerals or marks.

Figure 7A:
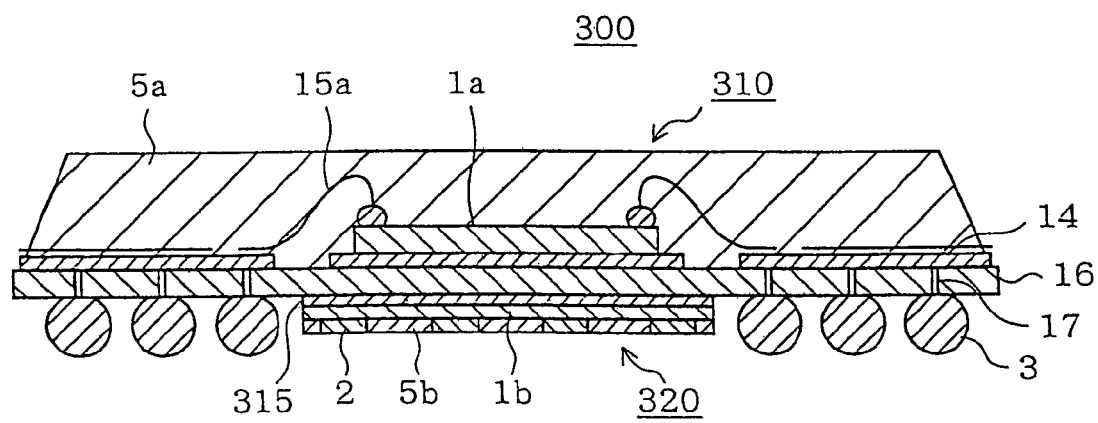
FIGS. 7A and 7B are cross-sectional views for explaining the structure of an entire semiconductor device according to the third embodiment of the invention.

The semiconductor device 300 shown in FIG. 7A is characterized by an adhesive 315 made of a low molecular material which is used for joining the backside surface of the second semiconductor device 320 to the first semiconductor device 310. This adhesive loses its adhesive strength when it is heated exceeding a predetermined temperature such as 200° C. or more used in the heat treatment for the reflowing step in the process of mounting the semiconductor device 300 on the printed board 13.

Figure 7B:
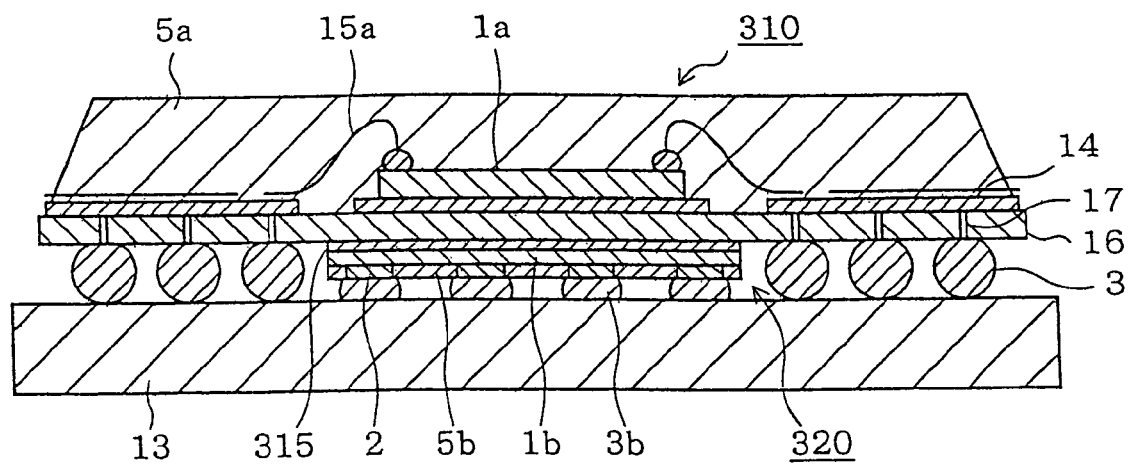

In the later manufacturing step, the semiconductor 300 is mounted on the printed board 13 as shown in FIG. 7B. At this stage, the low molecular adhesive 315 loses its adhesive strength as mentioned above, and the first and second semiconductor devices 310 and 320 are separated from each other.

Consequently, in the course of mounting the semiconductor device 300 on the printed board 13, the first and second semiconductor devices 310 and 320 are separated from each other, thus each positioning of them being carried out independently. With the effect of such self-alignment, both of the first and second semiconductor devices can be mounted on the printed board with the precise positioning, respectively.

Fourth Embodiment

Figure 8A:
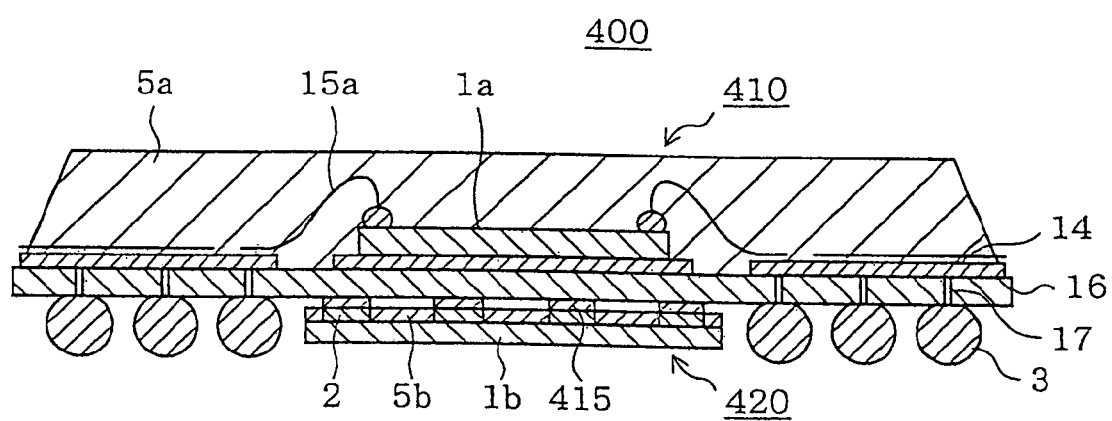
FIGS. 8A and 8B are cross-sectional views for explaining the structure of an entire semiconductor device according to the fourth embodiment of the invention.

A semiconductor device 400 according to this embodiment will be described with reference to FIG. 8. Again, in order to avoid repetitive redundant descriptions, the structural elements almost identical to those of the semiconductor device 100 are denoted with like numbers or marks.

In the semiconductor device 100, the surface having no terminal of the second semiconductor device 120 is joined to the backside surface of the first semiconductor device 110 with the help of the adhesive 115, thereby mounting the second semiconductor 120 on the first semiconductor device 110. As shown in FIG. 8, however, the semiconductor device 400 is characterized in that the terminals 2 of the second semiconductor device 420 are joined to the backside surface of the first semiconductor device 410 through soldered joints 415, thereby mounting the second semiconductor device 420 on the first semiconductor device 410.

On the backside surface of an epoxy base plate 16 on which a plurality of bumps 3 are provided, there is formed a predetermined wiring pattern (not shown) which forms conductive paths between bumps 3 and corresponding terminals 2 of the second semiconductor device 420. Therefor, according to this structure, the first and second semiconductor devices 410 and 420 are electrically connected with each other on the backside of the epoxy base plate 16.

Figure 8B:
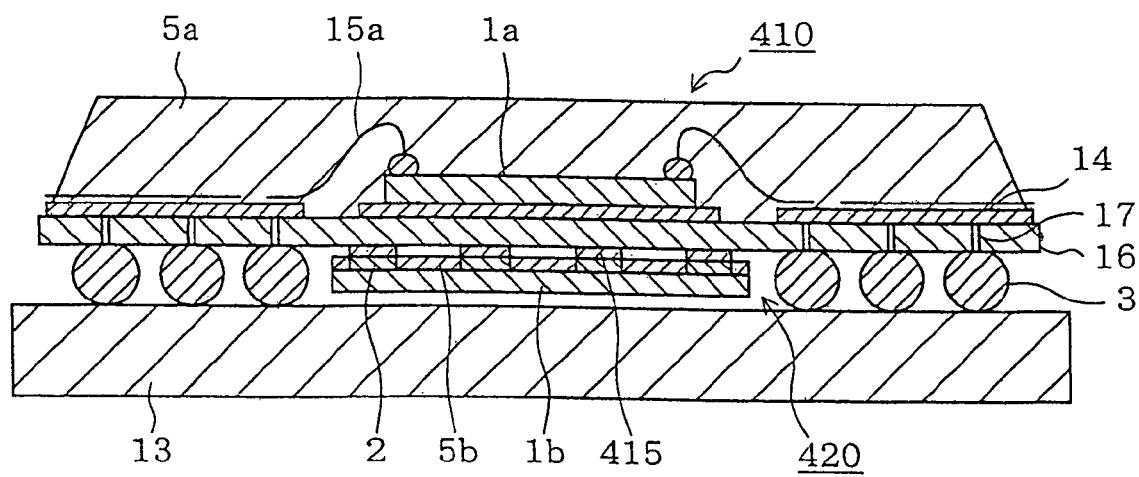

According to the semiconductor device 400, as shown in FIG. 8B, at the stage of mounting it on the printed board 13 in the later manufacturing step, the number of terminals needed for the entire device is not increased, thus the step of mounting the semiconductor device 400 on the printing board 13 being carried out with ease.

Figure 9A:
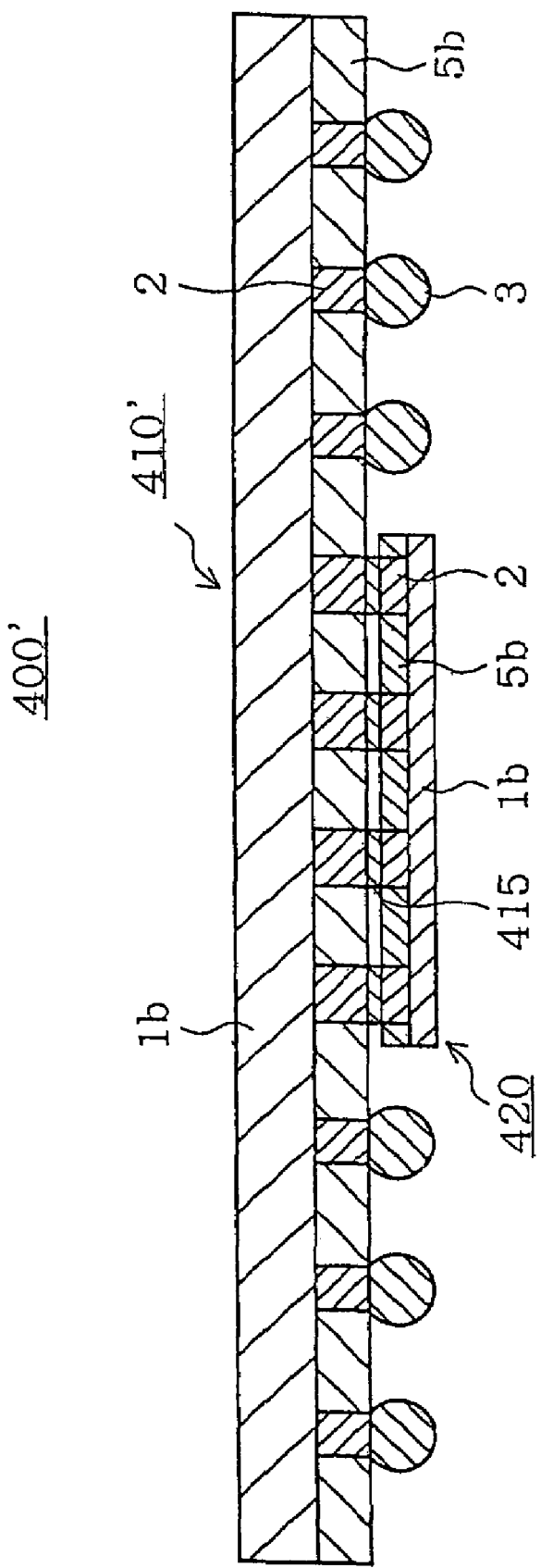
FIGS. 9A and 9B show diagrams for explaining an application example of the fourth embodiment according to the invention.
Figure 9B:
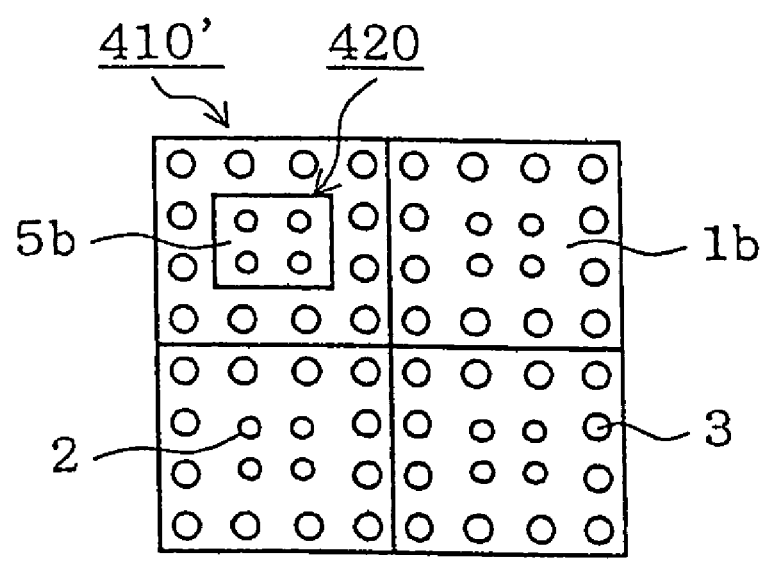

The fourth embodiment of the invention has been explained by way of the semiconductor device 400 which employs the first BGA semiconductor device 410. However, this is only an example, by which the invention should not be limited. For instance, as shown in FIG. 9A, the first BGA semiconductor device may be constructed as the first CSP semiconductor device 410' similar to the second CSP semiconductor device 420. As shown in FIG. 9B, the first CSP semiconductor device 410' includes an area similar to that of the first BGA semiconductor 410, for mounting the second CSP semiconductor device 420 thereon. In this case, however, the area includes no bumps 3 but electrodes 2 are exposed to the surface thereof, instead, and the terminals 2 of the first semiconductor device 410' are electrically connected with the corresponding terminals 2 of the second semiconductor device 420 through soldered joints 415. The structure similar to this is applicable to the embodiments described in the following.

Fifth Embodiment

A semiconductor device 500 according to this embodiment results from improvement of the semiconductor device 400 according to the fourth embodiment. A common point between the semiconductor devices 500 and 400 exists in that the terminal of the second semiconductor device 520 is joined to the backside surface of the first semiconductor device 510 by means of soldered joints 415, thereby mounting the second semiconductor device 520 on the first semiconductor device 510. The improved point of the semiconductor 500 will be described with reference to FIG. 10. As is previously noted, in order to avoid redundant repetition of detailed descriptions, the structural elements almost identical to those described in the previous embodiments are designated by like reference numerals or marks.

Figure 10A:
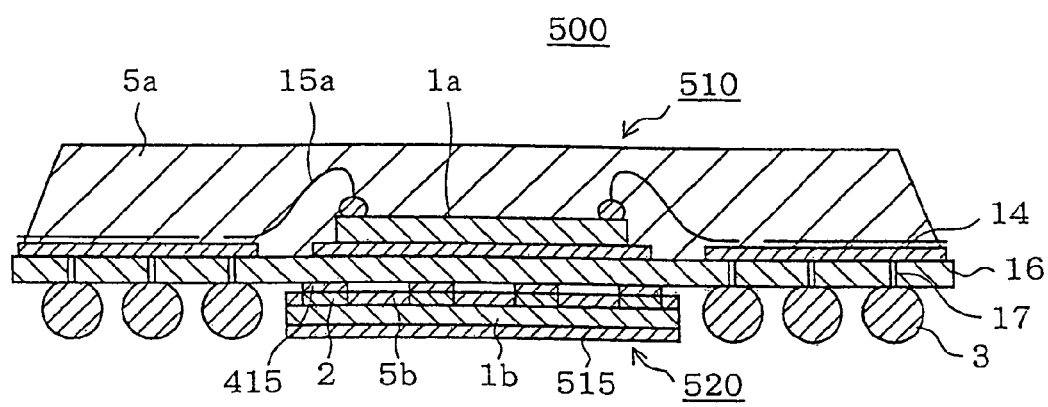
FIGS. 10A and 10B are cross-sectional views for explaining the structure of an entire semiconductor device according to the fifth embodiment of the invention.

As shown in FIG. 10A, the semiconductor device 500 is characterized by a high heat-conductive adhesive member 515 which is stuck on the backside surface of the second semiconductor device 520. In the figure, the adhesive member 515 is illustrated as a sheet-like member having a predetermined thickness.

Figure 10B:
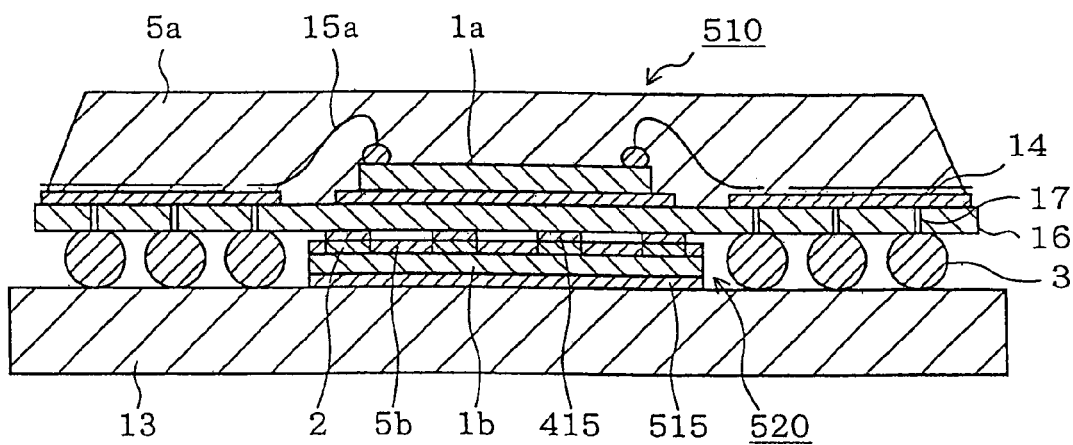

The semiconductor device 500 is mounted, as shown in FIG. 10B, on the printed board 13 in the later manufacturing step. At this time, the second semiconductor device 520 is fixed on the printed board 13 with the help of the adhesive strength of the adhesive member 515.

As described above, in the semiconductor device 500, the second semiconductor device 520 is mounted on the printed board 13 with the help of the high heat-conductive adhesive member 515, thus improving and facilitating the thermal radiation of the second semiconductor device 520.

Sixth Embodiment

A semiconductor device 600 according to this embodiment results from improvement of the-semiconductor device 400 according to the fourth embodiment. A common point between the semiconductor devices 600 and 400 exists in that the terminal of the second semiconductor device 620 is joined to the backside surface of the first semiconductor device 610 by means of soldered joints, thereby mounting the second semiconductor device 620 on the first semiconductor device 610. The improved point of the semiconductor 600 will be described with reference to FIG. 11. As is previously noted, in order to avoid redundant repetition of detailed descriptions, the structural elements almost identical to those described in the previous embodiments are designated by like reference numerals or marks.

Figure 11A:
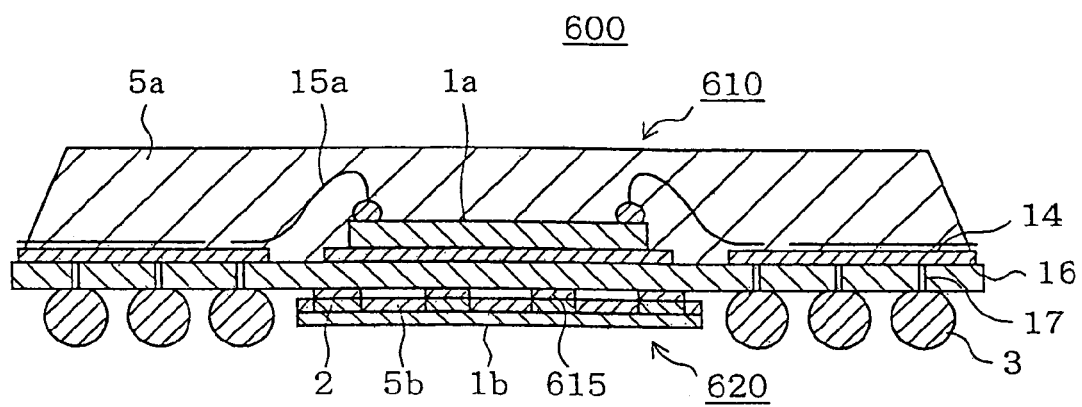
FIGS. 11A and 11B are cross-sectional views for explaining the structure of an entire semiconductor device according to the sixth embodiment of the invention.
Figure 11B:
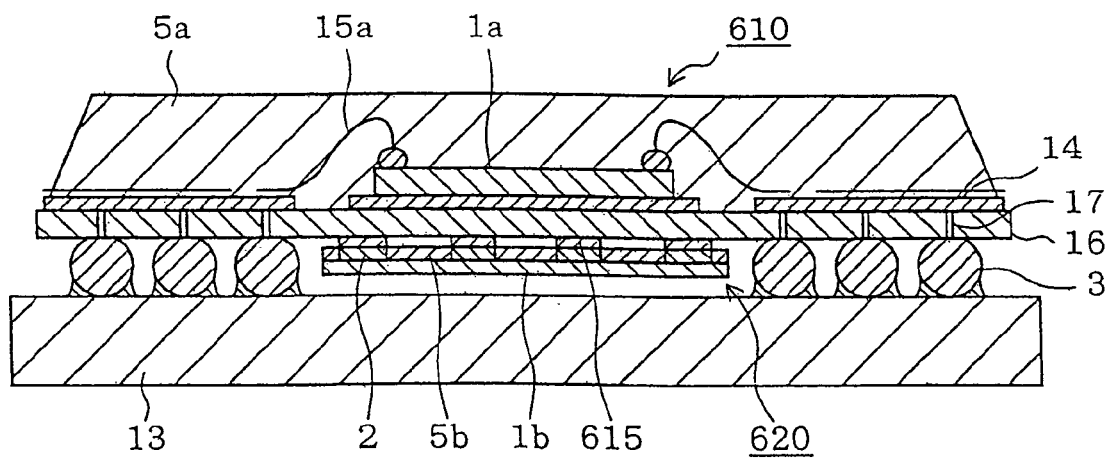

As shown in FIG. 11A, the semiconductor device 600 is characterized by a high temperature solder 615 which is employed for joining the terminal of the second semiconductor device 620 with the first semiconductor device 610. This high temperature solder 615 has a high melting point such as 200° C. or more, which is higher than the temperature employed in the course of the heat treatment executed in the later manufacturing step for mounting the semiconductor device 600 on the printed board 13 as shown in FIG. 11B.

As described above, according to the semiconductor device 600, if there is executed the heat treatment for the reflowing step in the process of mounting the semiconductor device 600 on the printed board 13, the second semiconductor device 620 is still firmly joined to the first semiconductor 610 with the high temperature solder, thus enabling the semiconductor device 600 to be stably packaged on the printed board.

Seventh Embodiment

Figure 12:
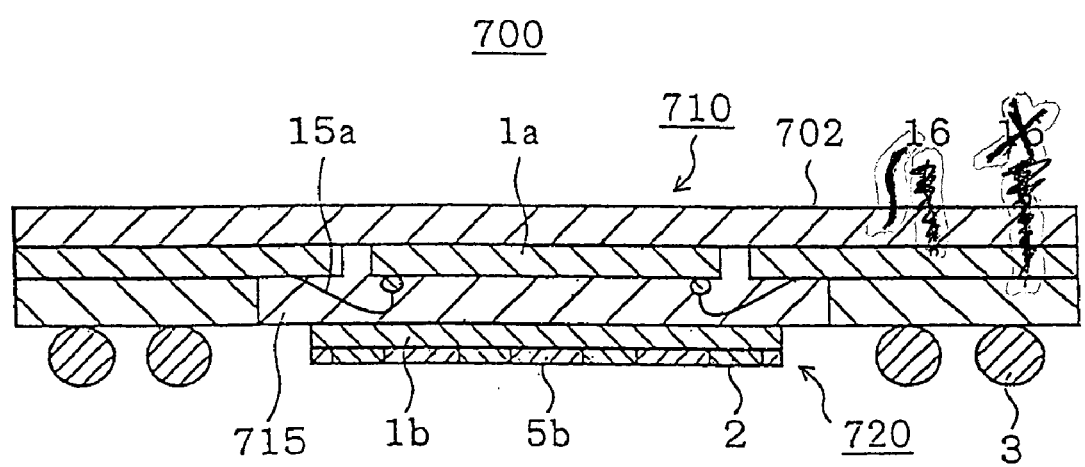
FIG. 12 is a cross-sectional view for explaining the structure of an entire semiconductor device according to the seventh embodiment of the invention.

A semiconductor device 700 according to this embodiment will now be described with reference to FIG. 12. As is previously noted, in order to avoid redundant repetition of detailed descriptions, the structural elements almost identical to those of the semiconductor device 100 according to the first embodiment are designated by like reference numerals or marks.

In the semiconductor device 100, the second semiconductor device 120 is joined to the backside surface of the first semiconductor device 110 with the help of the adhesive 115, thereby mounting the second semiconductor 120 on the first semiconductor device 110. As shown in FIG. 12, however, the semiconductor device 700 is characterized in that the second semiconductor device 720 is joined to the backside surface of the first semiconductor device 710 through a sealing resin 715, thereby mounting the second semiconductor device 720 on the first semiconductor device 710.

The first semiconductor device 710 includes a semiconductor element 1a and an epoxy base plate 16, on which there are provided a predetermined wiring pattern and, if needed, a heat radiation plate 702. The semiconductor element 1a is fixed on the epoxy base plate 16 with the help of an adhesive while the electrodes on the semiconductor element 1a are connected with corresponding wiring pattern of the epoxy base plate 16 through thin metal wires 15a, respectively. Accordingly, the surface of the epoxy base plate 16 is made conductive with the wiring patterns formed thereon, thus being electrically connected with corresponding bumps 3 which are arranged on the backside surface of the first semiconductor device 710.

The second semiconductor device 720 is mounted on the first semiconductor device 710 with the help of a sealing resin 715. In this case, the sealing resin 715 is first applied to a predetermined portion (shown as a recess or spot facing portion in the figure) of the first semiconductor device 710 so as to seal the semiconductor element 1a. The second semiconductor 720 is then put on the applied sealing resin before it is cured. The second semiconductor 720 is firmly joined together with the first semiconductor device 710 when the sealing resin 715 is completely cured.

In the semiconductor device 700 as mention above, the second semiconductor, device 720 is directly adhered to the sealing resin portion of the first semiconductor device 710, so that there is no need for other fixing member such as an adhesive to be employed, thus the manufacturing steps being simplified and the manufacturing cost being reduced.

As will be understood from the descriptions relating to the above-mentioned embodiments, the invention provides various advantages. That is, the invention makes it possible to execute the high-density packaging of semiconductor devices without lowering the final manufacturing yield thereof; to mount the semiconductor device on the printed board even if it has a little thicker dimension; to enhance reliability with regard to the connection between structural elements of the semiconductor device; to execute the precise positioning of semiconductor devices on the printed board; to facilitate the heat radiation of the semiconductor device; and to package the semiconductor devices on the printed board with high stability.

While the semiconductor device and the method for manufacturing the same according to the invention have been described in detail by specific reference to preferred embodiments illustrated in accompanying drawings, the invention should not be limited thereby. It will be understood that one who is skilled in the art may make variations and modifications within the category of the technical thoughts recited in the scope of claims for patent as per attached herewith, and that those variations and modifications naturally fall in the technical scope of the invention.

The entire disclosure of Japanese Patent Application No. 11-187658 filed on Jul. 1, 1999 including specification, claims, drawings and summary is incorporated herein by reference in its entirety.

What is claimed is:

1. A semiconductor device comprising:
   a base plate having main and back surfaces;
   a first semiconductor element located above the main surface of the base plate;

a plurality of bumps formed on the back surface of the base plate;

a first sealing resin formed on the main surface of the base plate and on the first semiconductor element, to seal the first semiconductor element; and a second semiconductor element located on and to oppose a portion of the back surface of the base plate which does not have the plurality of bumps formed thereon, wherein the second semiconductor element has main and back surfaces, side surfaces between the main and back surfaces of the second semiconductor element, and a plurality of terminals which are formed on the main surface of the second semiconductor element and in contact with the base plate, wherein the back surface and an entirety of the side surfaces of the second semiconductor element are exposed, wherein all of the bumps are located on portions of the back surface of the base plate that are not below the first semiconductor element, wherein the main surface of the second semiconductor element is sealed with a second sealing resin so as to expose a part of each of the terminals, wherein a distance from a top surface of the first semiconductor element to a top surface of the first sealing resin is greater than a distance from the main surface of the base plate to the top surface of the first semiconductor element, and wherein the second semiconductor element is a chip size package disposed so that a gap without resin exists between the base plate and the chip size package.

2. The semiconductor device according to claim 1, wherein a thickness of the second semiconductor element including a thickness of the second sealing resin formed thereon is thinner than a thickness of the bumps.

3. The semiconductor device according to claim 1, wherein the portion of the back surface of the base plate has wiring patterns thereon.

4. The semiconductor device according to claim 3, wherein the terminals of the second semiconductor element are electrically connected to the wiring patterns of the base plate via solder joints.

5. A semiconductor device comprising:
a base plate having main and back surfaces;
a first semiconductor element located above the main surface of the base plate;
a plurality of bumps formed on the back surface of the base plate, wherein no bumps are positioned under the first semiconductor element;
a first sealing resin formed on the main surface of the base plate and on the first semiconductor element, to seal the first semiconductor element; and
a second semiconductor element located on and to oppose a portion of the back surface of the base plate which does not have the plurality of bumps formed thereon,
wherein the second semiconductor element has main and back surfaces, side surfaces between the main and back surfaces of the second semiconductor element, and a plurality of terminals which are formed on the main surface of the second semiconductor element and in contact with the base plate,
wherein the back surface and an entirety of the side surfaces of the second semiconductor element are exposed,
wherein the second semiconductor element has a size greater than a size of the first semiconductor element,
wherein the main surface of the second semiconductor element is sealed with a second sealing resin so as to expose a part of each of the terminals,
wherein a distance from a top surface of the first semiconductor element to a top surface of the first sealing resin is greater than a distance from the main surface of the base plate to the top surface of the first semiconductor element, and
wherein the second semiconductor element is a chip size package disposed so that a gap without resin exists between the base plate and the chip size package.

6. The semiconductor device according to claim 5, wherein a thickness of the second semiconductor element including a thickness of the second sealing resin formed thereon is thinner than a thickness of the bumps.

7. The semiconductor device according to claim 5, wherein the portion of the back surface of the base plate has wiring patterns thereon.

8. The semiconductor device according to claim 7, wherein the terminals of the second semiconductor element are electrically connected to the wiring patterns of the base plate via solder joints.

* * * * *